(12) United States Patent
Matsuo

(10) Patent No.: US 11,862,510 B2
(45) Date of Patent: Jan. 2, 2024

(54) SEMICONDUCTOR DEVICE MANUFACTURING METHOD AND SEMICONDUCTOR DEVICE

(71) Applicant: Kioxia Corporation, Tokyo (JP)

(72) Inventor: Mie Matsuo, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 162 days.

(21) Appl. No.: 17/375,500

(22) Filed: Jul. 14, 2021

(65) Prior Publication Data

US 2021/0343584 A1 Nov. 4, 2021

Related U.S. Application Data

(62) Division of application No. 16/566,351, filed on Sep. 10, 2019, now Pat. No. 11,101,167.

(30) Foreign Application Priority Data

Mar. 18, 2019 (JP) ................. 2019-050387

(51) Int. Cl.
  *H01L 21/762* (2006.01)
  *H01L 21/20* (2006.01)
  *H01L 21/683* (2006.01)

(52) U.S. Cl.
  CPC .... *H01L 21/76254* (2013.01); *H01L 21/2007* (2013.01); *H01L 21/6835* (2013.01); *H01L 2924/12042* (2013.01)

(58) Field of Classification Search
  None
  See application file for complete search history.

(56) References Cited

U.S. PATENT DOCUMENTS

| | | |
|---|---|---|
| 6,624,047 B1 | 9/2003 | Sakaguchi et al. |
| 8,461,017 B2 | 6/2013 | Sadaka et al. |
| 8,962,449 B1 | 2/2015 | Gandhi |
| 9,735,398 B2 | 8/2017 | Aoyama et al. |

(Continued)

FOREIGN PATENT DOCUMENTS

| | | |
|---|---|---|
| CN | 109273622 A | 1/2019 |
| JP | 2000-223681 A | 8/2000 |

(Continued)

OTHER PUBLICATIONS

U.S. Appl. No. 10/164,219 B2, filed Dec. 25, 2018, Aoyama, T. et al.

*Primary Examiner* — Asok K Sarkar
(74) *Attorney, Agent, or Firm* — Oblon, McClelland, Maier & Neustadt, L.L.P.

(57) ABSTRACT

A semiconductor device manufacturing method of an embodiment includes forming a first layer in a region of a first substrate excluding an outer peripheral portion thereof; forming a first semiconductor circuit above the first layer; for a second semiconductor circuit on a second substrate; forming a second layer with a predetermined width at an outer peripheral portion of the second substrate; bonding a surface of the first substrate on a side provided with the first semiconductor circuit and a surface of the second substrate on a side provided with the second semiconductor circuit; and applying tensile stress to the first layer and the second layer to debond the first layer and the second layer, thereby forming the second substrate including the first semiconductor circuit and the second semiconductor circuit.

10 Claims, 10 Drawing Sheets

(56) References Cited

U.S. PATENT DOCUMENTS

| | | |
|---|---|---|
| 2008/0280424 A1 | 11/2008 | Yamazaki et al. |
| 2013/0093063 A1 | 4/2013 | Shur |
| 2015/0044792 A1 | 2/2015 | Aoyama et al. |
| 2017/0358782 A1 | 12/2017 | Aoyama et al. |
| 2018/0134606 A1 | 5/2018 | Wagner |

FOREIGN PATENT DOCUMENTS

| | | |
|---|---|---|
| JP | 2002-289818 A | 10/2002 |
| JP | 2005-79393 A | 3/2005 |
| JP | 2007-234628 A | 9/2007 |
| JP | 2008-311621 A | 12/2008 |
| JP | 6092482 B2 | 3/2017 |

SEMICONDUCTOR DEVICE MANUFACTURING METHOD AND SEMICONDUCTOR DEVICE

CROSS-REFERENCE TO RELATED APPLICATIONS

This application is a divisional of U.S. application Ser. No. 16/566,351 filed Sep. 10, 2019. U.S. application Ser. No. 16/566,351 is based upon and claims the benefit of priority from Japanese Patent Application No. 2019-050387, filed on Mar. 18, 2019; the entire contents of each are incorporated herein by reference.

FIELD

Embodiments described herein relate generally a semiconductor device manufacturing method and a semiconductor device.

BACKGROUND

The technique of manufacturing a semiconductor device including two semiconductor circuits in such a manner that the semiconductor circuits are each formed on two substrates and these two substrates are bonded to each other has been known. In this case, a de-bondable layer is, for example, provided across an entire surface of a lower layer of the semiconductor circuit of one substrate, and after bonding of the substrates, the processing of removing one substrate at the de-bondable layer is performed.

DETAILED DESCRIPTION

A semiconductor device manufacturing method of an embodiment includes forming a first layer in a region of a first substrate excluding an outer peripheral portion thereof; forming a first semiconductor circuit above the first layer; forming a second semiconductor circuit on a second substrate different from the first substrate; forming a second layer with a predetermined width at an outer peripheral portion of the second substrate; bonding a surface of the first substrate on a side provided with the first semiconductor circuit and a surface of the second substrate on a side provided with the second semiconductor circuit; and debonding the first layer and the second layer, thereby forming the second substrate including the first semiconductor circuit and the second semiconductor circuit.

Hereinafter, the present invention will be described in detail with reference to the drawings. Note that the present invention is not limited to the following embodiment. Moreover, components in the following embodiment include components easily arrived by those skilled in the art and substantially identical components.

(Configuration Example of Semiconductor Device)

Figure 1:
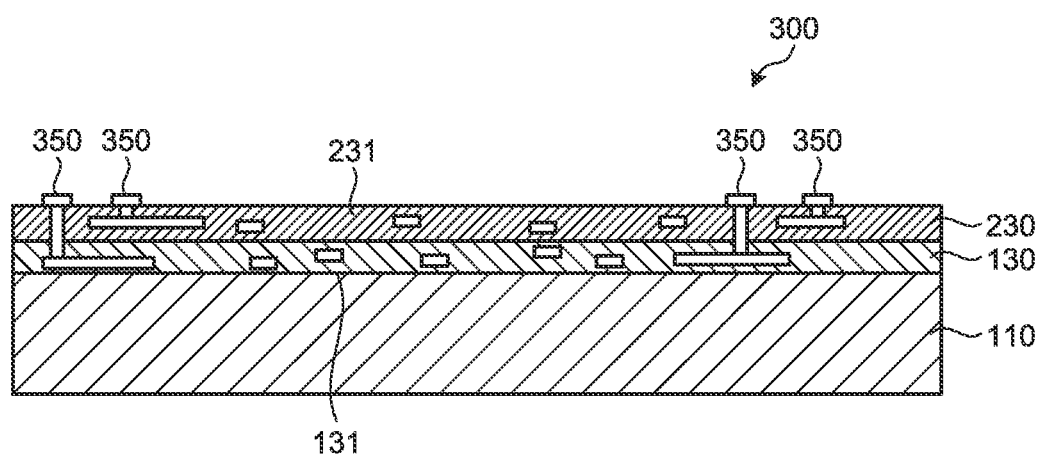
FIG. 1 is a view illustrating a configuration example of a semiconductor device according to an embodiment.

FIG. 1 is a view illustrating a configuration example of a semiconductor device 300 according to the embodiment. As illustrated in FIG. 1, the semiconductor device 300 includes a substrate 110, semiconductor circuits 131 and 231, and external terminals 350.

The substrate 110 may be, for example, a semiconductor substrate such as a silicon substrate, a ceramic substrate, or a Glass substrate. The substrate 110 is thinned by grinding, and is diced into a chip shape.

A multilayer film 130 including the semiconductor circuit 131 is arranged on one surface of the substrate 110. A multilayer film 230 including the semiconductor circuit 231 is arranged on the multilayer film 130. For example, a thin film of silicon may be arranged on the multilayer film 230.

As described later, an interface between the multilayer films 130 and 230 is a bonded surface at which the multilayer films 130 and 230 are bonded to each other. At least the outermost surfaces of the multilayer films 130 and 230 include insulating layers of $SiO_2$, SION, SiCN, etc.

The semiconductor circuits 131 and 231 are, for example, flash memories such as three-dimensional NAND flash memories, capacitors or dynamic random access memories (DRAMs), and other memories. For example, the semiconductor circuits 131 and 231 may be photodiodes of image sensors, or may be logic circuits including complementary metal oxide semiconductor (CMOS) transistors. Moreover, the semiconductor circuits 131 and 231 may be the same type of circuit, or may be different circuits.

The multiple external terminals 350 are arranged at a surface layer of the semiconductor circuit 231. Some of the multiple external terminals 350 are connected to wiring of the semiconductor circuit 131 in the multilayer film 130. Some other external terminals 350 are connected to wiring of the semiconductor circuit 231 in the multilayer film 230.

The semiconductor device 300 is, for example, mounted on another substrate such as a printed-circuit board. Thus, the semiconductor circuits 131 and 231 can be electrically connected to each other at least through the external terminals 350. The semiconductor circuits 131 and 231 may have terminals (not illustrated) exposed at a bonded surface therebetween, and these terminals may be bonded to each other to electrically connect the semiconductor circuits 131 and 231. The terminals directly connecting the semiconductor circuits 131 and 231 to each other are, for example, made of copper (Cu), gold (Au), or platinum (Pt).

The semiconductor device 300 described above is manufactured in such a manner that two substrates 110 and 210 illustrated in FIGS. 2A, 2B, 3A, and 3B are bonded to each other, for example.

Figure 2A:
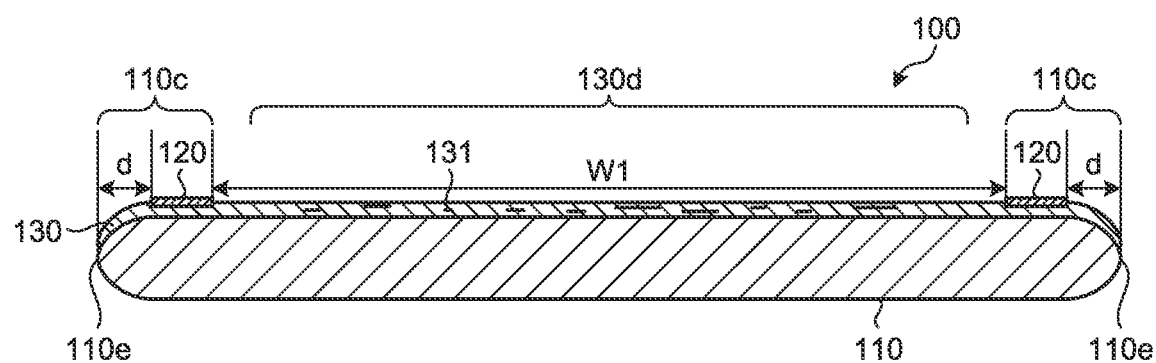
FIGS. 2A and 2B are views illustrating the configuration example of a semiconductor device according to the embodiment.
Figure 2B:
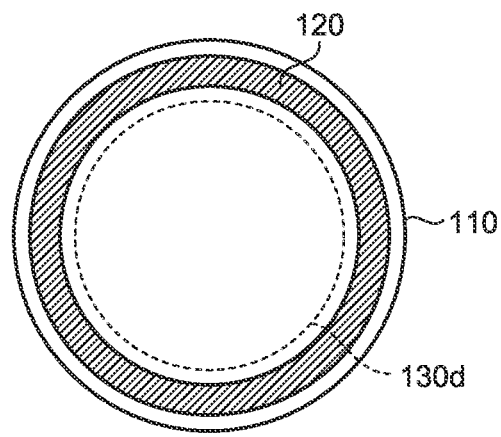

FIGS. 2A and 2B are views illustrating a configuration example of a semiconductor device 100 according to the embodiment. FIG. 2A is a sectional view of the semiconductor device 100, and FIG. 2B is a plan view of the semiconductor device 100. Note that the multilayer film 130 is not illustrated in FIG. 2B.

As illustrated in FIGS. 2A and 2B, the semiconductor device 100 includes the substrate 110, a de-bondable layer 120, and the multilayer film 130.

The de-bondable layer 120 with a predetermined width is arranged at an outer peripheral portion 110c of the substrate 110. The de-bondable layer 120 is a weak layer relatively-easily cleavable by tensile stress. One end of the de-bondable layer 120 on an end portion (edge) 110e side of the substrate 110 is arranged inward of the substrate 110 by a distance d of equal to or longer than 2.0 nm from an end portion 110e of the substrate 110, for example. The other end of the de-bondable layer 120 on a central (center) side of the substrate 110, i.e., the inner peripheral diameter of the de-bondable layer 120, is a distance W1.

The multilayer film 130 has the semiconductor circuit 131 arranged in a device region 130d within the distance W1 of the substrate 110. The multilayer film 130 has multiple stacked structures including the semiconductor circuit 131, and as described above, at least the uppermost layer is the insulating layer. A terminal made of metal may be provided at a surface of the insulating layer in some cases.

Figure 3A:
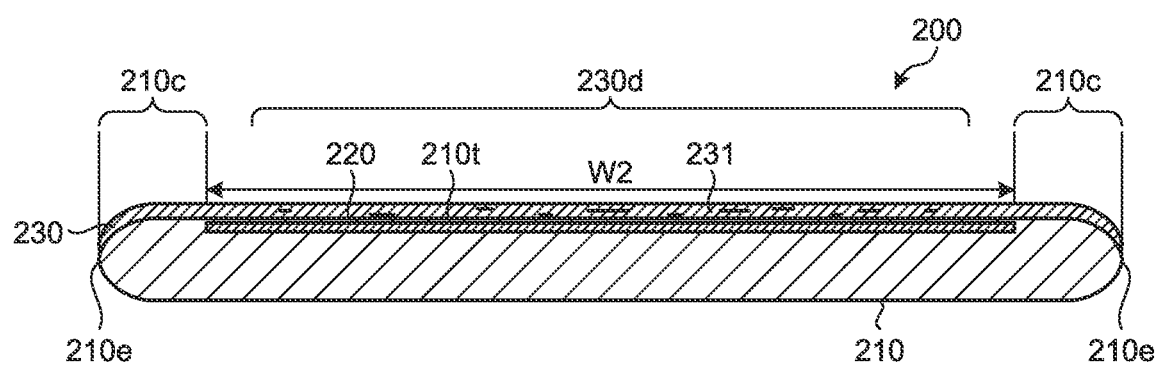
FIGS. 3A and 3B are views illustrating the configuration example of a semiconductor device according to the embodiment.
Figure 3B:
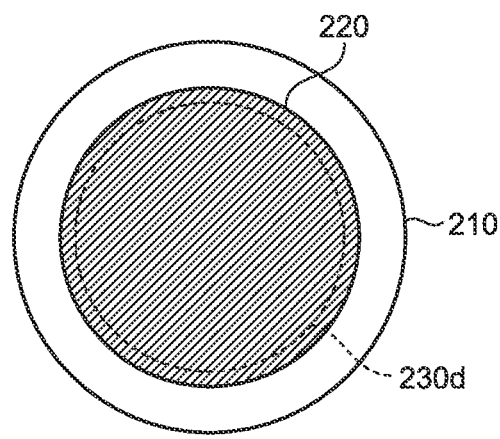

FIGS. 3A and 3B are views illustrating a configuration example of a semiconductor device 200 according to the embodiment. FIG. 3A is a sectional view of the semiconductor device 200, and FIG. 3B is a plan view of the semiconductor device 200. Note that the multilayer film 230 is not illustrated in FIG. 3B.

As illustrated in FIGS. 3A and 3B, the semiconductor device 200 includes the substrate 210, a de-bondable layer 220, and the multilayer film 230.

The substrate 210 may be, for example, a semiconductor substrate such as a silicon substrate, a ceramic substrate, or a glass substrate. The diameter of the substrate 210 is, for example, substantially equal to the diameter of the substrate 110.

The de-bondable layer 220 is arranged at a predetermined depth from a surface of the substrate 210 in a region excluding an outer peripheral portion 210c. The de-bondable layer 220 is, for example, a weak layer relatively-easily cleavable by tensile stress. The outermost peripheral diameter of the de-bondable layer 220 is a distance W2. The width of the outer peripheral portion 210c of the substrate 210 is narrower than the width of the outer peripheral portion 110c of the substrate 110 described above. The distance W2 as the diameter of the de-bondable layer 220 is longer than the distance W1 as the inner peripheral diameter of the de-bondable layer 120 described above.

As described above, the de-bondable layer 220 is at the predetermined depth from the surface of the substrate 210. For example, a silicon thin layer 210t as part of the substrate 210 is arranged at an upper layer of the de-bondable layer 220.

The multilayer film 230 has the semiconductor circuit 231 arranged in a device region 230d within the distance W2 of the substrate 210. The multilayer film 230 has multiple stacked structures including the semiconductor circuit 231, and as described above, at least the uppermost layer is the insulating layer. A terminal made of metal may be provided at a surface of the insulating layer in some cases. The device region 230d of the semiconductor device 200 has a size substantially equal to that of the device region 130d of the semiconductor device 100 described above.

(Example of Processing of Manufacturing Semiconductor Device)

Next, examples of the processing of manufacturing the semiconductor devices 100, 200, and 300 of the embodiment will be described with reference to FIGS. 4A to 6D.

Figure 4A:
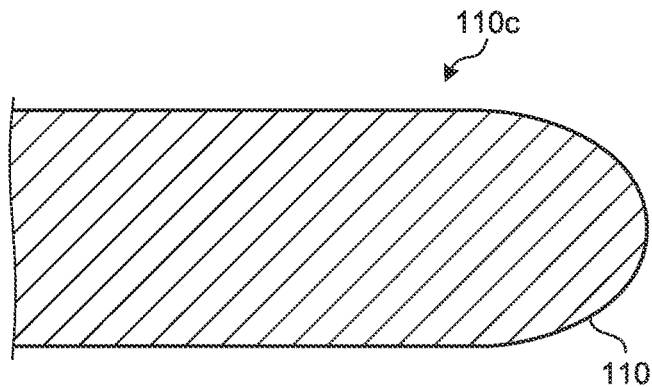
FIGS. 4A to 4C are flow diagrams illustrating one example of the steps of the processing of manufacturing the semiconductor device of the embodiment.
Figure 4B:
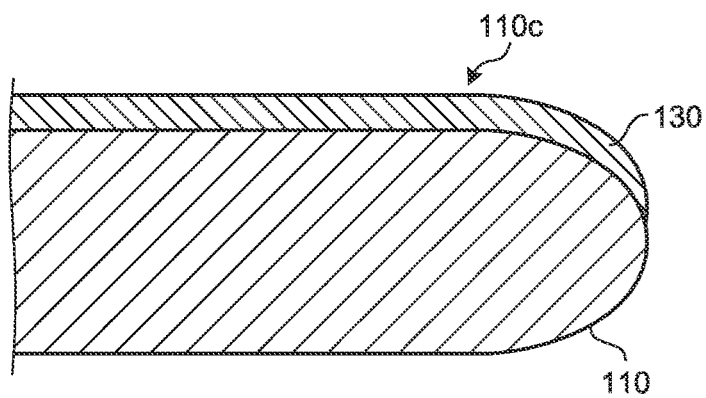
Figure 4C:
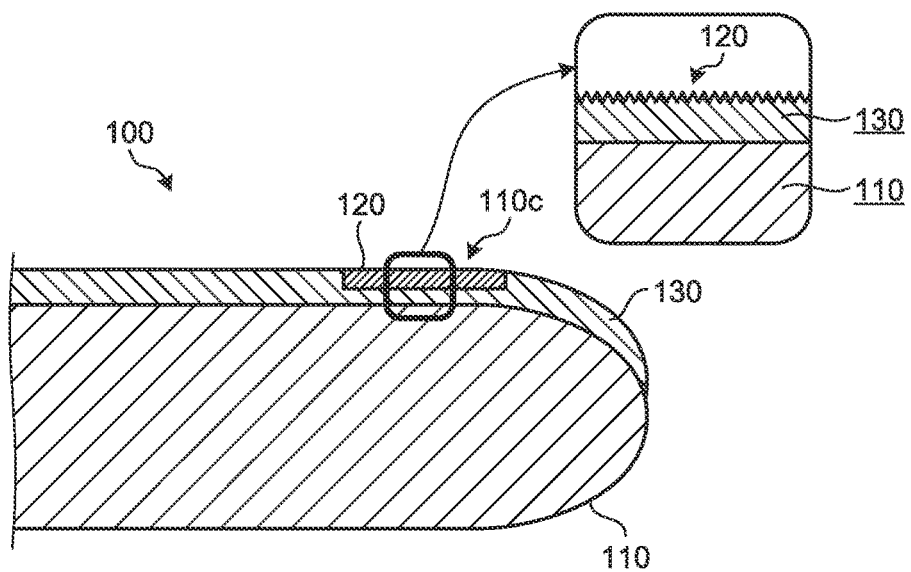

FIGS. 4A to 4C are flow diagrams illustrating one example of the steps of the processing of manufacturing the semiconductor device 100 of the embodiment.

As illustrated in FIG. 4A, the substrate 110 is prepared.

As illustrated in FIG. 413 the multilayer film 130 is formed on the substrate 110. The semiconductor circuit 131 in the multilayer film 130 can be formed using a normal semiconductor circuit manufacturing technique.

As illustrated in FIG. 4C, the de-bondable layer 120 is formed at the outer peripheral portion. 110c of the substrate 110. The de-bondable layer 120 is formed in such a manner that a surface of the multilayer film 130 is roughened by polishing with a buff or corrosion with a fluorine-based etching solution, for example. At this point, a surface roughness is preferably equal to or greater than 50 nm.

As described above, the processing of manufacturing the semiconductor device 100 of the embodiment ends.

Figure 5A:
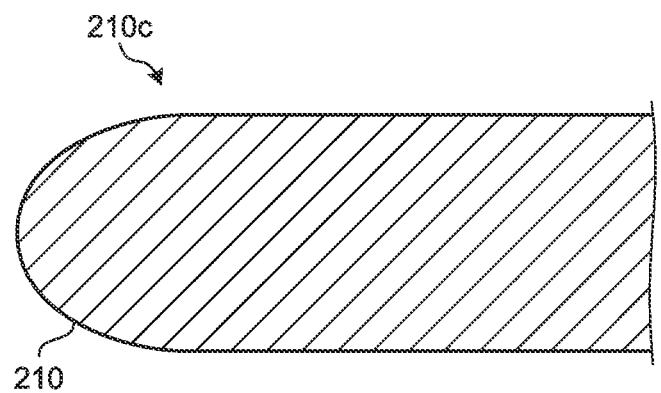
FIGS. 5A to 5C are flow diagrams illustrating one example of the steps of the processing of manufacturing the semiconductor device of the embodiment.
Figure 5B:
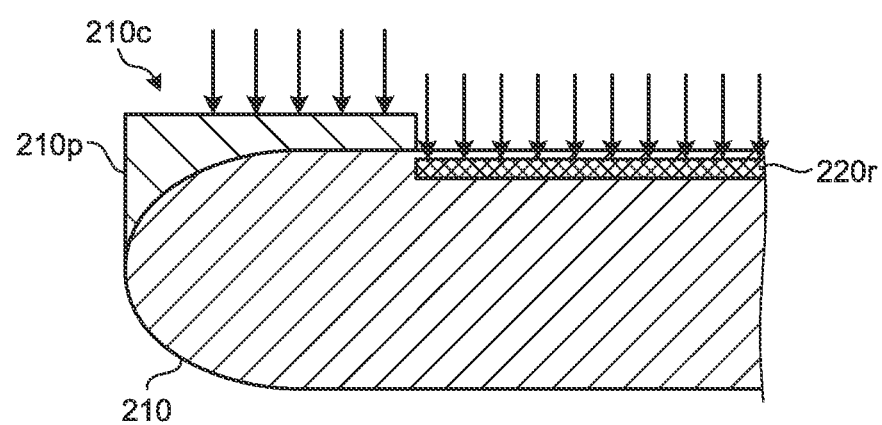
Figure 5C:
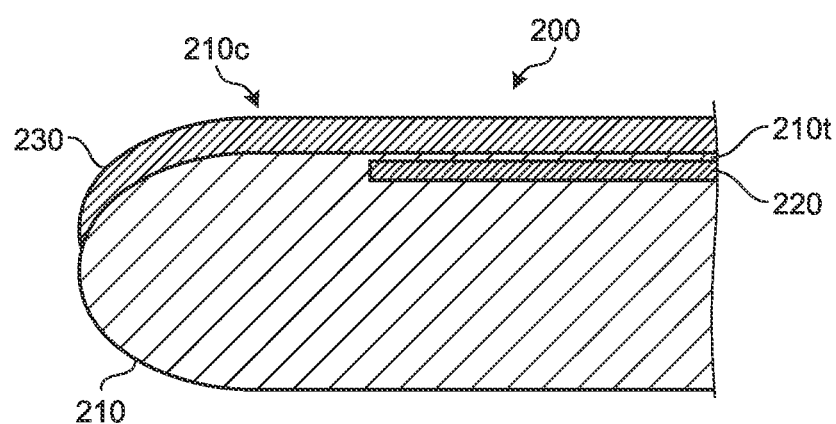

FIGS. 5A to 5C are flow diagrams illustrating one example of the steps of the processing of manufacturing the semiconductor device 200 of the embodiment.

As illustrated in FIG. 5A, the substrate 210 is prepared.

As illustrated in FIG. 5E, the outer peripheral portion 210c of the substrate 210 is covered with, e.g., a resist film 210p, and ions such as hydrogen ions, oxygen ions, argon ions, or helium ions are implanted (injected) to a predetermined depth of the substrate 210 inside the outer peripheral portion 210c.

Alternatively, the substrate 210 inside the outer peripheral portion 210c is irradiated with a laser whose focal point is adjusted to the predetermined depth of the substrate 210. In the case of laser irradiation, the resist film 210p is not necessarily provided. The outer peripheral portion 210c may be covered with, e.g., a metal layer with high reflectance such that laser transmission is prevented. Laser light may be, for example, ultraviolet light. Pulsed laser may be irradiated. In this case, a pulse width may be, for example, a picosecond, a nanosecond, or a femtosecond.

The substrate 210 at the predetermined depth is modified by ion implantation or laser irradiation, and turns into a weak modified layer 220r. Thereafter, the substrate 210 is annealed to stabilize the modified layer 220r, and in this manner, the de-bondable layer 220 is formed. By stabilization by annealing processing, cleavage of the de-bondable layer 220 in the middle of formation of the semiconductor circuit 231 can be reduced, for example.

As illustrated in FIG. 5C, the multilayer film 230 is formed on the thin layer 210t of the substrate 210 in which the de-bondable layer 220 is formed. The semiconductor circuit 231 in the multilayer film 230 can be formed using a normal semiconductor circuit manufacturing technique.

As described above, the processing of manufacturing the semiconductor device 200 of the embodiment ends.

FIGS. 6A to 6D are flow diagrams illustrating one example of the steps of the processing of manufacturing the semiconductor device 300 of the embodiment.

Figure 6A:
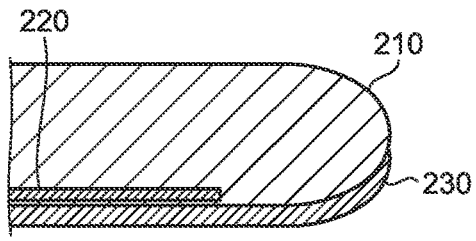
FIGS. 6A to 6D are flow diagrams illustrating one example of the steps of the processing of manufacturing the semiconductor device of the embodiment.
Figure 6A:
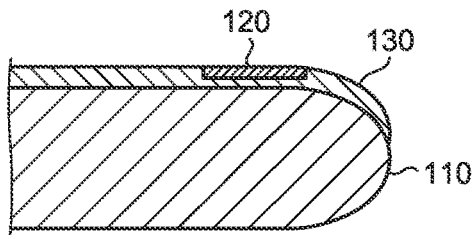

As illustrated in FIG. 6A, the substrates 110 and 210 are arranged in a state in which the multilayer films 130 and 230 formed as described above face each other. The outermost insulating lavers of the multilayer films 130 and 230 are, for example, activated by plasma processing.

Figure 6B:
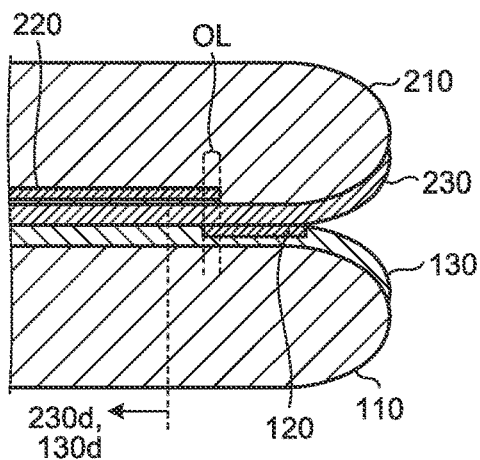

As illustrated in FIG. 6B, the activated insulating layers contact each other, and the substrates 110 and 210 are bonded to each other by the insulating layers. When the insulating layers have, e.g., metal terminals, the terminals are also bonded to each other. A bonding technique at this point is metal bonding such as Cu—Cu bonding, Au—Au bonding, or Pt—Pt bonding. That is, in a case where the insulating layers have, e.g., the metal terminals, hybrid bonding of bonding between the insulating layers and bonding between the terminals is employed.

At the substrates 110 and 210 bonded to each other, the device regions 130d and 230d of the multilayer films 130 and 230 are arranged at positions facing each other. That is, the semiconductor circuits 131 and 231 face each other.

At the substrates 110 and 210 bonded to each other, the de-bondable layer 120 is bonded to a surface of the multilayer film 230 of the substrate 210. The de-bondable layer 120 has surface roughness as described above, and a bonded area between the de-bondable layer 120 and the multilayer film 230 is smaller than that of a flat surface. Thus, a bonding strength between the de-bondable layer 120 and the multilayer film 230 is weaker than those in other regions. Moreover, at least part of the de-bondable layers 120 and 220 has a portion OL overlapping with each other as viewed from above.

Figure 6C:
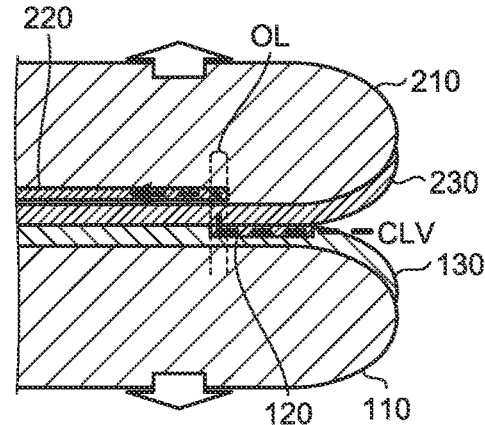

As illustrated in FIG. 6C, tensile stress is applied to the de-bondable layers 120 and 220. The tensile stress can be applied in such a manner that at least one of the substrates 110 and 210 is separated from the other one of the substrates 110 and 210, for example. At this point, a blade may be inserted to between the substrates 110 and 210. Alternatively, fluid spraying with a water jet or gas spraying with an air blade may be performed for a portion between the substrates 110 and 210, for example.

In this manner, the de-bondable layer 120 with a weak bonding strength is, for example, debonded from an end portion 110e side of the substrate 110, and therefore, a cleavage groove CLV is caused. The cleavage groove CLV extends inward of the substrate 110 along the de-bondable layer 120. When reaching the portion OL at which the de-bondable layers 120 and 220 overlap with each other, the cleavage groove CLV extends toward a substrate 210 side, and reaches the de-bondable layer 220. The cleavage groove CLV having reached the de-bondable layer 220 extends inward of the substrate 210 along the de-bondable layer 220. Eventually, the de-bondable layers 120 and 220 across the entire surfaces of the substrates 110 and 210 are debonded, and the substrates 110 and 210 are separated from each other.

Note that when the de-bondable layer 120 is debonded, the de-bondable layer 120 may be debonded at any of a portion inside the de-bondable layer 120, a portion at an interface between the de-bondable layer 120 and the multilayer film 130, and a portion at an interface between the de-bondable layer 120 and the multilayer film 230. When the de-bondable layer 220 is debonded, the de-bondable layer 220 may be debonded at any of a portion inside the de-bondable layer 220, a portion at an interface between the de-bondable layer 220 and the substrate 210, and a portion at an interface between the de-bondable layer 220 and the thin layer 210t.

Figure 6D:
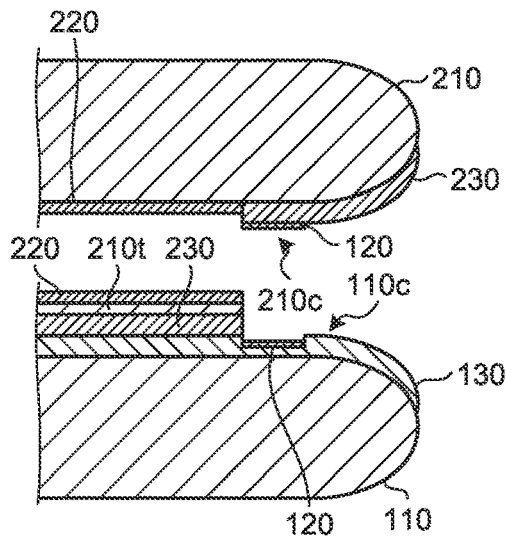

As illustrated in FIG. 6D, the substrate 110 separated as described above is arranged such that the multilayer film 230 separated from the substrate 210 and including the semiconductor circuit 231 is on the multilayer film 130 including the semiconductor circuit 131 and the thin layer 210t is on the multilayer film 230. That is, the substrate 110 has both of the semiconductor circuits 131 and 231. Note that part or the entirety of the debonded de-bondable layer 120 may be present on the multilayer film 130 at the outer peripheral portion 110c. Moreover, part or the entirety of the debonded de-bondable layer 220 may be present on the thin layer 210t.

Thereafter, the substrate 110 is surface-cleaned and flattened. Thereafter, a via 340 and the external terminals 350 are formed, and therefore, the semiconductor device 300 is manufactured. Note that by cleaning processing and flattening processing, at least the de-bondable layers 120 and 220 are eliminated from the substrate 110.

Moreover, the thin layer 210t and the multilayer film 230 are absent in a region of the substrate 210 separated as described above inside the outer peripheral portion 210c. That is, the semiconductor circuit 231 is eliminated from the substrate 210. Note that part or the entirety of the debonded de-bondable layer 220 may be present on the substrate 210 in the region inside the outer peripheral portion 210c. Moreover, part or the entirety of the debonded de-bondable layer 120 may be present on the multilayer film 230 at the outer peripheral portion 210c.

Thereafter, the substrate 210 is re-utilized as a recycled substrate after, e.g., the cleaning processing and the flattening processing.

As described above, the processing of manufacturing the semiconductor device 300 of the embodiment ends.

Comparative Example

In the processing of manufacturing a semiconductor device of a comparative example, a substrate configured such that a multilayer film is formed on a de-bondable layer formed across an entire surface of the substrate and a substrate configured such that a multilayer film is formed without a de-bondable layer are used. However, when the de-bondable layer is formed across the entire surface of the substrate, the de-bondable layer might be, in some cases, debonded in the middle of formation of a semiconductor circuit even before bonding of the substrates, and the multilayer film and the substrate might be separated from each other, for example.

The semiconductor device 200 of the embodiment includes the de-bondable layer 220 arranged in the region excluding the outer peripheral portion 210c. Thus, separation of the multilayer film 230 and the substrate 210 in the middle of formation of the semiconductor circuit 231 is reduced, for example. Thus, a yield ratio in the processing of manufacturing the semiconductor device 200 is improved.

The semiconductor device 100 of the embodiment includes the de-bondable layer 120 having the predetermined width and arranged at the outer peripheral portion 110c. Thus, after the multilayer films 130 and 230 have been bonded to each other, the substrate 210 can be more reliably separated. Thus, a yield ratio in the processing of manufacturing the semiconductor device 300 is improved.

The semiconductor device 300 of the embodiment is manufactured by separation of the substrates 110 and 210. Thus, separation is allowed without grinding and removing the substrate 210, for example. Consequently, re-utilization of the substrate 210 is allowed. As a result, a cost for the processing of manufacturing the semiconductor device 300 can be reduced.

(First Variation)

Next, the processing of forming a de-bondable layer 121 on the substrate 110 in a first variation of the embodiment will be described with reference to FIGS. 7A to 7D. The first variation is an example in a case where a terminal 140 is provided at the surface of the multilayer film 130.

FIGS. 7A to 7D are flow diagrams illustrating one example of the steps of the processing of forming the de-bondable layer 121 according to the first variation of the embodiment.

Figure 7A:
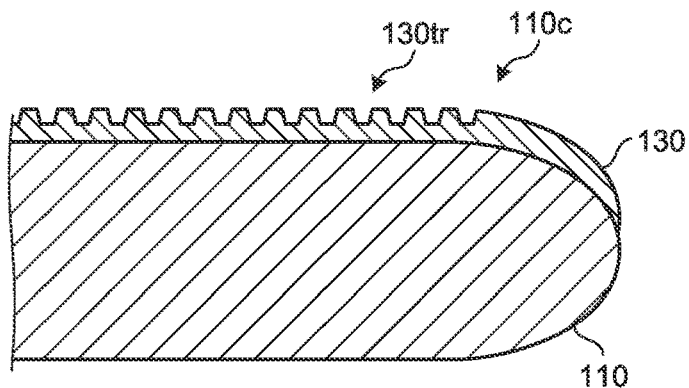
FIGS. 7A to 7D are flow diagrams illustrating one example of the steps of the processing of forming a de-bondable layer according to a first variation of the embodiment.

As illustrated in FIG. 7A, multiple grooves 130tr are formed at a surface layer portion of the multilayer film 130 of the substrate 110.

Figure 7B:
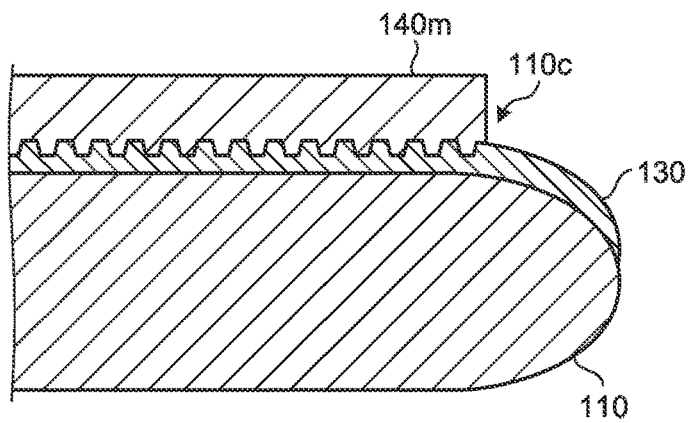

As illustrated in FIG. 7B, a metal layer 140m of, e.g., copper, gold, or platinum is formed on the multilayer film 130 interposing not-illustrated barrier metal, and the grooves 130tr are filled with the metal layer 140m. The metal layer 140m can be formed by plating processing, for example.

Figure 7C:
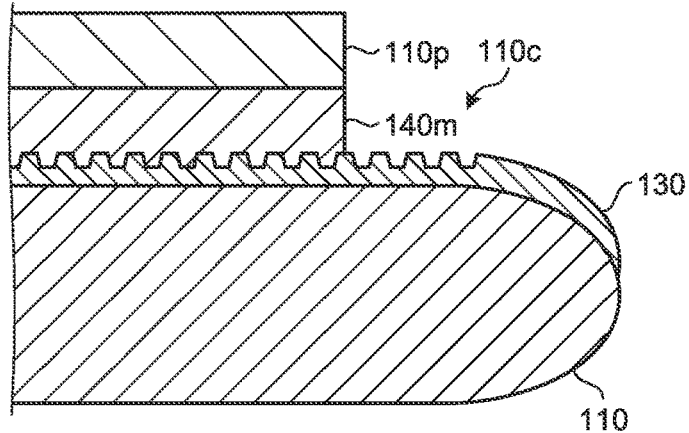

As illustrated in FIG. 7C, a resist pattern 110p is formed on the metal layer 140m excluding the outer peripheral portion 110c of the substrate 110, and the metal layer 140m at the outer peripheral portion 110c is removed by wet etching.

Figure 7D:
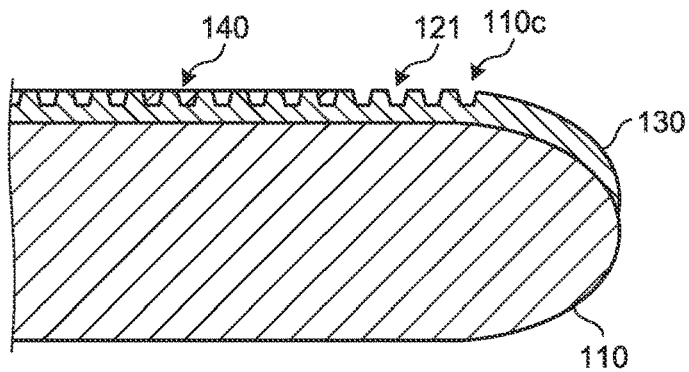

As illustrated in FIG. 7D, the metal layer 140m remaining inside the outer peripheral portion 110c is removed by, e.g., chemical mechanical polishing (CEP), and a terminal 140 is formed only in the filled grooves 130tr. The de-bondable layer 121 having the multiple grooves 130tr is formed at the outer peripheral portion 110c.

A bonded area between the de-bondable layer 121 and the multilayer film 230 of the substrate 210 can be decreased by the multiple grooves 130tr, and a bonding strength can be weakened.

(Second Variation)

Next, the de-bondable layer 220 arranged on the substrate 210 in a second variation of the embodiment will be described with reference to FIG. 8. The de-bondable layer 220 of the second variation is different from that of the above-described embodiment in that the de-bondable layer 220 is arranged in a predetermined layer on the substrate 210.

Figure 8:
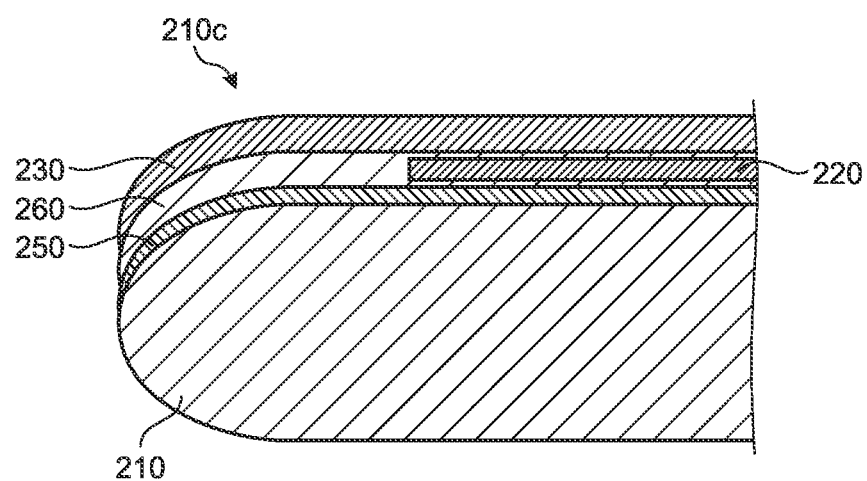
FIG. 8 is a view illustrating a de-bondable layer arranged on a substrate according to a second variation of the embodiment.

FIG. 8 is a view illustrating the de-bondable layer 220 arranged on the substrate 210 according to the second variation of the embodiment. As illustrated in FIG. 8, an insulating layer 250 is arranged on the substrate 210 of the second variation. A semiconductor layer 260 is arranged on the insulating layer 250. The multilayer film 230 is arranged on the semiconductor layer 260.

The insulating layer 250 is, for example, a SiO$_2$ layer, and as described later, functions as a protection layer upon formation of the de-bondable layer 220 in the semiconductor layer 260.

The semiconductor layer 260 is, for example, a polysilicon layer or an amorphous silicon layer. The de-bondable layer 220 is arranged in the semiconductor layer 260.

In the above-described embodiment, the ions are implanted to the predetermined depth of the substrate 210, or the predetermined depth of the substrate 210 is irradiated with the laser whose focal point is adjusted to the predetermined depth. In this manner, the de-bondable layer 220 is formed in the substrate 210.

However, as in the configuration of the second variation, the semiconductor layer 260 for injecting the de-bondable layer 220 to above the substrate 210 protected by the insulating layer 250 may be provided, and the de-bondable layer 220 may be formed in the semiconductor layer 260.

Thus, the substrate 210 can be protected while the de-bondable layer 220 can be more reliably formed in an intended layer.

(Third Variation)

Figure 9A:
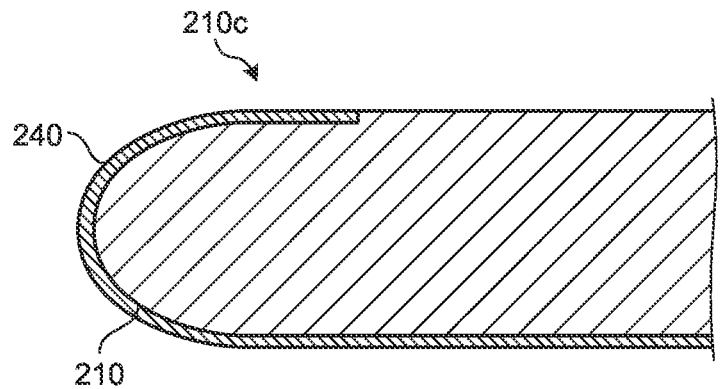
FIGS. 9A to 9C are flow diagrams illustrating one example of the steps of the processing of forming a de-bondable layer according to a third variation of the embodiment.
Figure 9B:
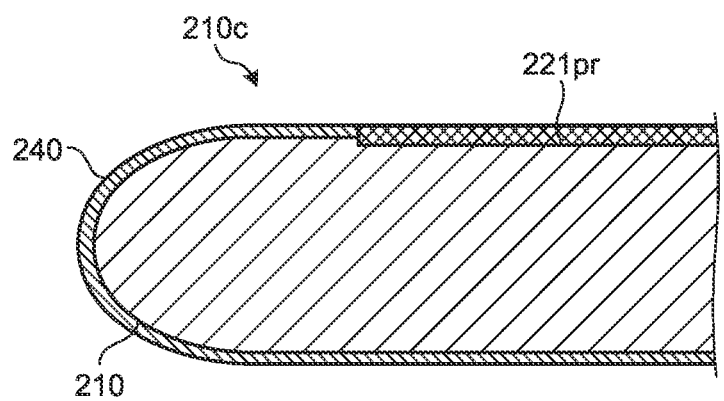
Figure 9C:
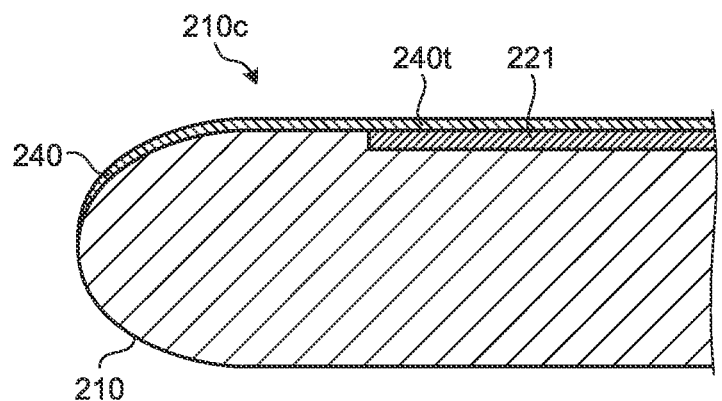

Next, the processing of forming a de-bondable layer 221 on the substrate 210 in a third variation of the embodiment will be described with reference to FIGS. 9A to 9C. FIGS. 9A to 9C are flow diagrams illustrating one example of the steps of the processing of forming the de-bondable layer 221 according to the third variation of the embodiment.

As illustrated in FIG. 9A, an insulating layer 240 such as a silicon oxidized layer is, for example, formed on front and back surfaces of the substrate 210, except for the region of the substrate 210 inside the outer peripheral portion 210c.

As illustrated in FIG. 9B, the region of the substrate 210 inside the outer peripheral portion 210c is anodically oxidized. Specifically, current is, for example, applied in a hydrofluoric acid ethanol solution with the substrate 210 serving as an anode. Thus, micropores with a diameter of several nm are formed at a surface layer portion of the substrate 210, and a porous layer 221pr as a porous surface layer of the substrate 210 is formed.

As illustrated in FIG. 9C, the insulating layer 240 on the back surface of the substrate 210 is removed, and a surface of the porous layer 221pr is flattened by annealing to form the de-bondable layer 221. An insulating thin layer 240t such as a silicon oxidized layer may be formed on the de-bondable layer 221.

Note that the substrate 210 of the third variation does not have the thin layer 210t of, e.g., silicon. Thus, in a case where any of the semiconductor circuits formed on the substrates 110 and 210 includes a configuration in which a diffusion layer is provided at a surface layer of a semiconductor layer, such as a CMOS transistor, such a semiconductor circuit is formed on the substrate 110.

(Fourth Variation)

Figure 10A:
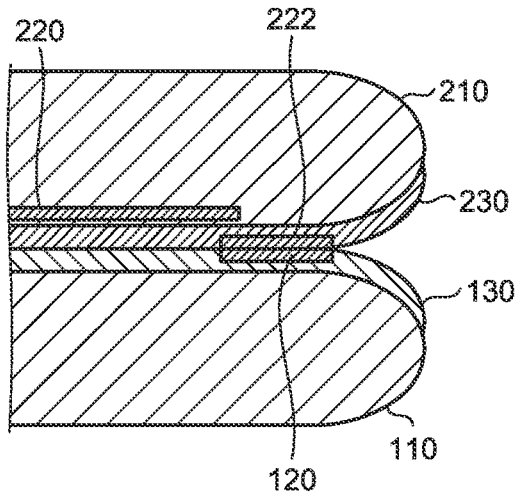
FIGS. 10A to 10C are views illustrating variations of a de-bondable layer according to a fourth variation of the embodiment.
Figure 10B:
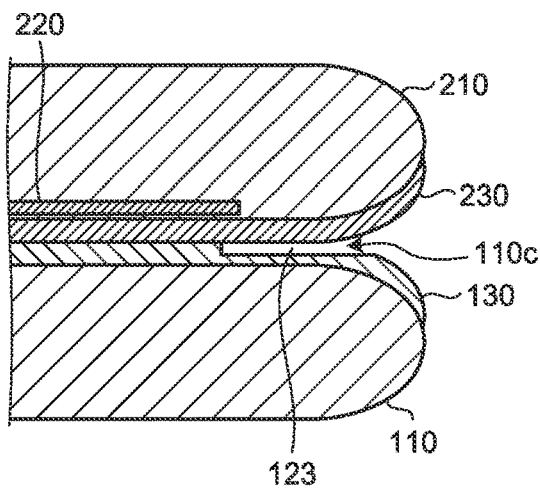
Figure 10C:
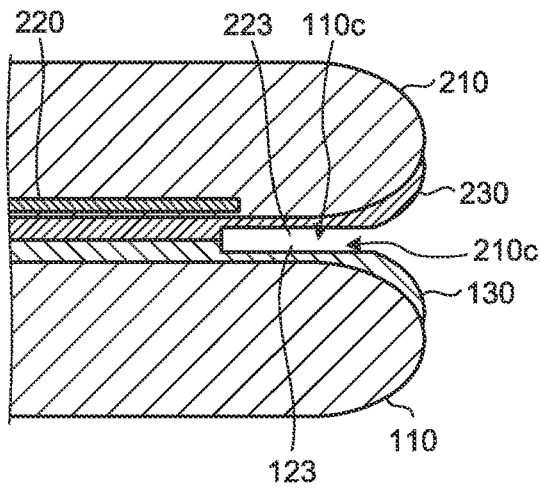

In a fourth variation, variations of the de-bondable layer provided at the outer peripheral portion will be described with reference to FIGS. 10A to 10C. FIGS. 10A to 10C are views of the variations of the de-bondable layer according to the fourth variation of the embodiment.

As illustrated in FIG. 10A, the de-bondable layer at the outer peripheral portion may be provided on both of the substrates 110 and 210. That is, in addition to the de-bondable layer 120 of the substrate 110, a de-bondable layer 222 may be arranged on the substrate 210 at a position corresponding to the de-bondable layer 120 of the substrate 110.

As in the above-described embodiment and the first variation, the de-bondable layer 222 can be also formed by, e.g., the processing of roughening a surface or the processing of forming grooves not filled with metal.

As illustrated in FIG. 10B, a gap 123 may be provided between the substrates 110 and 210 instead of the de-bondable layer at the outer peripheral portion. That is, at least part of the multilayer film 130 at the outer peripheral portion 110c of the substrate 110 is removed, and in this manner, the gap 123 is formed. Thus, the substrates 110 and 210 are not bonded to each other at the outer peripheral portions 110c and 210c, and advantageous effects similar to those or the de-bondable layer 120 of the embodiment are provided.

As illustrated in FIG. 10C, a gap 223 may be also provided at the substrate 210. That is, in addition to the gap 123 at the outer peripheral portion 110c of the substrate 110, the gap 223 is also provided at the outer peripheral portion 210c of the substrate 210. In this case, as in the gap 123 of the substrate 110, at least part of the multilayer film 230 at the outer peripheral portion 210c is removed, and in this manner, the gap 223 can be also formed at the substrate 210.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first substrate having a first bottom surface and a first top surface opposite to the first bottom surface, the first substrate being a whole wafer;
a first layer arranged in a region of the first substrate excluding an outer peripheral portion thereof, the first layer having a second bottom surface and a second top surface opposite to the second bottom surface, the second bottom surface is positioned deeper than the first top surface; and
a first film including a first semiconductor circuit arranged above the first layer.

2. The semiconductor device according to claim 1, wherein
the first layer is any of:
a layer that an elemental ion is injected to a predetermined depth of the first substrate or a layer arranged on the first substrate,
a layer that the predetermined depth of the first substrate is irradiated with a laser, and
a layer that a region of the first substrate inside the outer peripheral portion thereof is anodically oxidized.

3. The semiconductor device according to claim 1, further comprising:
a second substrate, the second substrate being a whole wafer;
a second film including a second semiconductor circuit arranged on the second substrate; and
a second layer arranged with a predetermined width on the second film at an outer peripheral portion of the second substrate.

4. The semiconductor device according to claim 3, wherein
the second layer is any of:
a layer with an increased surface roughness of the second film at the outer peripheral portion of the second substrate, and
a layer with a groove disposed on the second film at the outer peripheral portion of the second substrate, and
a step disposed on the second film at the outer peripheral portion of the second substrate such that the outer peripheral portion is provided lower than a bonded surface between the first substrate and the second substrate.

5. The semiconductor device according to claim 1, wherein
a third layer not connected to the first layer is provided above the first film at the outer peripheral portion of the first substrate.

6. The semiconductor device according to claim 1, wherein
the second top surface is positioned deeper than the first top surface.

7. A semiconductor device comprising:
a first substrate, the first substrate being a whole wafer;
an insulating layer arranged on the first substrate;
a semiconductor layer arranged on the insulating layer;
a first layer buried in the semiconductor layer in a region of the first substrate excluding an outer peripheral portion thereof; and
a first film including a first semiconductor circuit arranged above the first layer.

8. The semiconductor device according to claim 7, wherein
the first layer is either of:
a layer that an elemental ion is injected to a predetermined depth of the semiconductor layer, and
a layer that the predetermined depth of the semiconductor layer is irradiated with a laser.

9. The semiconductor device according to claim 7, wherein
the first layer includes:
a material which is the same with a material of the semiconductor layer, and
an elemental ion injected to the material.

10. The semiconductor device according to claim 7, wherein
the first layer is:
a layer that the predetermined depth of the semiconductor layer is irradiated with a laser.

* * * * *